United States Patent [19]
Rostoker

[11] Patent Number: 5,644,102
[45] Date of Patent: Jul. 1, 1997

[54] INTEGRATED CIRCUIT PACKAGES WITH DISTINCTIVE COLORATION

[75] Inventor: Michael D. Rostoker, Boulder Creek, Calif.

[73] Assignee: LSI Logic Corporation, Milpitas, Calif.

[21] Appl. No.: 203,919

[22] Filed: Mar. 1, 1994

[51] Int. Cl.$^6$ .................................................. H05K 5/00
[52] U.S. Cl. .......................................... 174/52.1; 174/52.4
[58] Field of Search .................................. 174/52.1–52.4; 257/678, 701, 730, 787, 797; 361/752, 760, 764, 772, 777, 783; 283/74, 81, 99, 107, 114; 29/832–834, 837; 156/60, 63, 349

[56] References Cited

U.S. PATENT DOCUMENTS 4,939,316   7/1990   Mahulikar et al. ................ 174/52.4

*Primary Examiner*—Bot L. Ledynh
*Attorney, Agent, or Firm*—Katz & Cotton, LLP

[57] ABSTRACT

A technique is described for providing body coloration and colored indicia for indicating one or more characteristics of an integrated circuit device. Package body coloration is one source of information about device characteristics. Other indications relate to colored indicia. The colored indicia are relatively large and easily viewable from distances too great for printed text on the package body to be read comfortably. The indicia is (are) colored other than black or white. Among the visible indicia characteristics which can be used to convey information are: indicia color (or colors on multi-colored indicia), shape, size, orientation, and/or location. Among the various integrated circuit device characteristics which can be conveyed by the indicia characteristics are: device function, device speed, level of testing, degree of rad-hardness, location of reference pin, side, corner or surface, location and function of groups of pins carrying related signals, etc. In order to facilitate assembly, colored indicia matching those on the integrated circuit devices can be printed on a printed circuit board substrate at locations and in orientations on the printed circuit corresponding to the correct assembled positions of the integrated circuit devices. Colored areas can also be incorporated into semiconductor packages to control (alter, modify) the thermal characteristics of the package, particularly in order that thermal stresses on a die operating within the package can be reduced and equalized.

4 Claims, 7 Drawing Sheets

INTEGRATED CIRCUIT PACKAGES WITH DISTINCTIVE COLORATION

TECHNICAL FIELD OF THE INVENTION

The invention relates to integrated circuit, semiconductor devices and, more particularly, to the packaging of these devices and, more particularly, to the visual appearance of the packages.

BACKGROUND OF THE INVENTION

In order to handle and connect a semiconductor die (integrated circuit device) to external systems, it is generally necessary to package the die. This usually involves mounting the die to some sort of substrate, leadframe or carrier, connecting bond pads on the die to some sort of conductive lines or traces within the package, and forming a package body around the die. The conductive lines or traces conductively exit the package body, and usually terminate in external leads, or pins or ball bumps which are suitable for connecting the packaged semiconductor die to additional elements of an electronic system.

For example, ceramic packages have a package body with a central opening (cavity) in one face for receiving the die, and lead fingers embedded in the body and extending into the opening. The die is connected (usually wire bonded) to the exposed (in the opening) portions of the lead fingers. The lead fingers are connected (internally in the package) to pins exiting a planar surface of the package. These pins are typically arranged in a rectangular (e.g., square) array. In some instances, the die-receiving cavity is "up", on one face of the package body, and the pins (e.g.) are on the other, opposite face of the package body. In other instances, the die-receiving cavity is "down", on the same face of the package as the pins (in which case there are no pins in the area of the cavity). (The pins are deemed to be on the "bottom" of the ceramic body.) In either case, the cavity is covered by a lid. In either case, an external surface of the package, when the package is mounted to a circuit board (e.g.), is visible to an observer. (Evidently, the surface of the package which is against the circuit board is not visible to an observer after the package is mounted to a circuit board.)

In another example, the die is attached and connected (usually wire bonded) to a relatively rigid (thick) lead frame having several conductive lines, and a plastic body is molded around the die and inner ends of the conductive lead frame lines. Outer ends of the lead frame lines exit the plastic body on two or four sides. Again, an external surface of the package, when mounted to a circuit board (e.g.), is visible to an observer. (Evidently, the surface of the package which is against the circuit board is not visible to an observer.)

In another example, the die is attached to a relatively flexible (thin) lead frame supported by a plastic tape, and is encapsulated in epoxy or the like. Outer ends of the lead frame lines exit the epoxy body. Both wire bonding and tape-automated bonding of the die to the lead frame lines are well known in tape packages. Typically, the die and inner portions of the tape substrate are encapsulated by a glob-top epoxy, which typically is visible to an observer when the package is mounted to a circuit board (e.g.).

Another packaging technique is mounting the die directly to a printed circuit board (PCB; also referred to as PWB, or printed wiring board) substrate. The die is connected (typically wire bonded, but may be flip-chipped) to one end of conductive traces on a face (surface) of the PCB. Typically, the die and surrounding portions of the PCB are encapsulated by a glob-top epoxy, or overmolded by plastic. In either case, a surface of the package body is visible to an observer when the package is mounted to a circuit board (e.g.).

In the assembly and subsequent inspection of semiconductor devices to circuit boards, it is essential that the proper device be mounted to the proper site on the board, and that the device is properly oriented at its location. For example, if the device is rotated 90, 180 or 270 degrees from its proper orientation it most certainly will not function as planned, since the pin-outs would be entirely wrong. To this end, certain semiconductor packages have some sort of locating/orienting feature, such as one of the corners of the package body being chamfered, an advertently missing pin, or the like. These solutions are complex, and require re-tooling to convert a non-orientation-sensitive package design to an orientation-sensitive package design. Further, semiconductor devices having different functionality may be packaged with the same package, appearing indistinguishable to an observer. Evidently, inserting the "wrong" device into a circuit board will produce inapposite results.

In some cases, different "grades" of the same device are available from a manufacturer, and the different grades may have the same visual appearance as one another. This necessitates certain inventory controls, such as labeling the trays holding the devices for shipment. Should the label come off of the tray, it may not be evident what grade of device is contained in the tray. Examples of functionality differences or different grades of the same device include radiation-hardened devices versus non-radiation-hardened, source of manufacture or distribution, various speed ratings, optionally available functions, as well as "lots" of devices that have been 100% inspected versus lots that have only been fractionally sampled. (It is also possible that the labels are or become illegible, or simply cannot be read by the user.)

What is needed is a technique for applying indicia to a semiconductor package that determines its "correct" orientation, and that differentiates the device from other, similarly-packaged devices.

It is generally well known that an operating semiconductor die will generate heat, and that it is generally beneficial to provide a heat sink, or the like, to dispose of such heat. It is also generally well known that different areas (i.e., types of circuits) on the die will generate different amounts of heat when the die is operating (e.g., based on power consumption by a circuit, speed of the circuit, etc.).

What is needed is a packaging technique that in and of itself, without the benefit of a separate heat sink, can dissipate heat in a manner superior to certain "plain" colored packages (e.g., white).

What is also needed is a packaging technique that can accommodate the different amounts of heat generated by corresponding different areas of the die operating within the package.

DISCLOSURE OF THE INVENTION

It is an object of the present invention to provide an improved technique for packaging integrated circuits.

It is another object of the present invention to provide a technique for visually differentiating one semiconductor device from another similarly packaged semiconductor device.

It is another object of the present invention to provide a technique for visually identifying one or more characteristics of a semiconductor device from distances (e.g., two or more feet) too great to read (e.g., one to two feet) printed label text on the semiconductor device.

It is another object of the present invention to provide a technique for readily identifying the orientation of a semiconductor device from distances beyond reading distance.

It is another object of the present invention to provide a technique for readily verifying correct relative orientations of two or more similarly or dissimilarly packaged integrated circuit devices.

It is another object of the present invention to provide a technique for facilitating fabrication of printed circuit assemblies.

It is another object of the present invention to provide a semiconductor packaging technique which exhibits improved heat-dissipating characteristics.

It is another object of the present invention to provide a semiconductor packaging technique that is "tuned" to the localized thermal characteristics of a die operating within the package.

According to the invention, the package body of a semiconductor device (whether ceramic, plastic, epoxy, or the like) is provided with an indicia of a unique orientation or the functionality of the device. The indicia is a color, other than white or black, that is either:

applied as a coating or a label to at least one surface of the device; or incorporated into the material forming the body of the device package.

Preferably, the indicia is applied to (or incorporated into) a surface of the device that will be visible to an observer after the device is mounted to a circuit board (e.g.). To this end, the indicia is applied to (or incorporated into) a particular surface of the packaged semiconductor device, but may completely cover the package.

According to an aspect of the invention, the indicia is applied to (or incorporated into) a substantial portion of at least one surface of the device. For example, the indicia covers up to 100% of a visible surface of the device, including at least 95%, at least 90%, at least 85%, at least 80%, and at least 75% of a visible surface.

According to an aspect of the invention, the indicia is applied to (or incorporated into) at least one selected area of at least one surface of the device. For example, the at least one selected area encompasses less than 75% of a visible surface of the device, including less than 70%, less than 65%, less than 60%, less than 55%, less than 50%, less than 45%, less than 40%, less than 35%, less than 30%, less than 25%, less than 20%, less than 15%, less than 10%, and less than 5%.

The indicia, being colored, and relatively large and devoid of intricate detail as compared to any printed information that may otherwise appear on the surface of the package, is readily discernable from distances considerably greater than reading distance (i.e., at distances greater than those at which typical printed text labels on an integrated circuit package can be comfortably read. On a typical integrated circuit package this will be distances greater than, for example, two feet). Further, any printed information may be user language unfriendly (for example, the printed information may be an alpha-numeric code word). The indicia disclosed herein are of universal applicability, since they convey information in a more symbolic and ergonomic manner that printed text and/or numerals. However, it should be understood that the indicia of the present invention can be used in conjunction with other information appearing on a surface of a semiconductor package.

According to an aspect of the invention, the indicia is applied to (or incorporated into) any conventional semiconductor (integrated circuit) package, including ceramic packages (including to the lids thereof), plastic-molded packages, and encapsulated packages (including transfer-molded, other leadframe-based i.e. resin-coated packages, PCB-based packages and tape substrate type packages).

According to an aspect of the invention, the indicia can be two-colored or multi-colored, and can be patterned in a variety of ways to convey information concerning the functionality and orientation of a semiconductor device.

According to an aspect of the invention, the size, color (or colors), shape, location, and/or orientation of a colored indicia can be used to visually indicate one or more characteristics of the integrated circuit upon which they appear. Among the many possible elements and combinations of indicia features conveying information regarding the characteristics of a packaged semiconductor device are:

indicia shape (e.g., diamond, square, triangle, logo . . . );

indicia color or colors (single or multi-color indicia);

indicia size and/or position on a surface of the package;

integrated circuit body (package) color;

number of indicia; and relative positions of more than one indicia.

Among the various characteristics of integrated circuit devices which can be indicated by body color and/or colored indicia are:

testing level (e.g., commercial, industrial, mil-spec);

radiation hardness of the integrated circuit;

functionality (e.g., microprocessor, ALU, peripheral controller, memory device, etc.);

source or origin of the device (e.g., manufacturer, distributor, etc.);

temperature and/or humidity range for operation;

method or process for design or manufacture (e.g., gate array, cell-based, embedded array, or CoreWare (tm) ASIC); of 1.0 micron, 0.8 micron, 0.5 micron, 0.35 micron process for manufacture of the integrated circuit; or 2, 3, 4 or higher layers of interconnect metal on the integrated circuit, etc.);

device speed;

availability of added (optional) functionality;

location and function of groups of functionally related pins of the integrated circuit device; and location of reference pin, side, corner, etc.

testing level (e.g., commercial, industrial, mil-spec);

radiation hardness of the integrated circuit;

functionality (e.g., microprocessor, ALU, peripheral controller, memory device, etc.);

source or origin of the device (e.g., manufacturer, distributor, etc.);

temperature and/or humidity range for operation;

method or process for design or manufacture (e.g., gate array, cell-based, embedded array, or CoreWare (tm) ASIC); of 1.0 micron, 0.8 micron, 0.5 micron, 0.35 micron process for manufacture of the integrated circuit; or 2, 3, 4 or higher layers of interconnect metal on the integrated circuit, etc.);

device speed;

availability of added (optional) functionality;

location and function of groups of functionally related pins of the integrated circuit device; and location of reference pin, side, corner, etc.

Further according to the invention, the dissipation of heat in a semiconductor package can be controlled and/or modified by the coloring of selected areas of the package. It is generally known that different colors will exhibit rates of heat absorption and radiation differing from black or white, even if the same materials are used.

According to the invention, colored (i.e., non-black, non-white) materials, such as colored plastic, epoxy or resin, are used for semiconductor packages to encapsulate or surround integrated circuit (IC) dies. The invention contemplates the use of materials having colors such as red, orange, yellow, green, blue, indigo and violet, as well as mixtures or shades of these colors.

According to a feature of the invention, the coloration (e.g., use of non-black, non-white coloring) can be provided over selected portions of the surface area of the integrated circuit package, including applied to the surface (such as the indicia discussed hereinabove), incorporated into the material of the package body, or applied to a lid of a lidded package. These selected, colored areas may correspond (i.e., be in close proximity to) to a particularly hot, or particularly cool area of the die. For example, a color which is a good dissipator of heat can be applied to an area of the package in close proximity to a particularly hot area of a die, and a color which is a relatively poor dissipator of heat can be applied to an area of the package in close proximity to a relatively cool area of the die. In this manner, thermal stresses across the entire area of the die can be normalized (equalized) to an extent not otherwise possible with a package that is simply black (e.g.).

It is further contemplated that a package, or a selected portion of a package can have a discrete colored element incorporated therein. Such a colored element may, for example, permit the filtering of light into the package onto a silicon die having photosensitive elements on its surface. The discrete, colored element can be inserted like a "slug" into the package body, or mounted onto the package body like a lens (and shaped like a lens).

According to a feature of the invention, different pigments, made from different materials, exhibit different amounts of reflectivity to non-visible electromagnetic energy. This property can be advantageously employed to control emissions by a semiconductor die within the package, or to control the impact of such energies from the environment onto the packaged die.

For example, selected portions of a package can be colored, to control heat (or electromagnetic) dissipation from corresponding selected areas of a die within the package. This functionality would be distinct from, but could be in addition to, providing visual indications of the correct orientation of the package.

It should be recognized that there are numerous possible variations, combinations and permutations of the aforementioned inventive technique, and that it is within the spirit and scope of the present invention to utilize them alone or in combination with one another.

Generally, as sued herein, the terms "color", "colored" and the like refer to colors that are neither black or white.

It should be understood that a distinct area of a black or white package body could be colored, according to the techniques of the present invention discussed hereinabove, including providing a colored area on any or all surfaces of a package body.

Other objects, features and advantages of the invention will become apparent in light of the following description thereof.

DETAILED DESCRIPTION OF THE INVENTION

Figure 1:
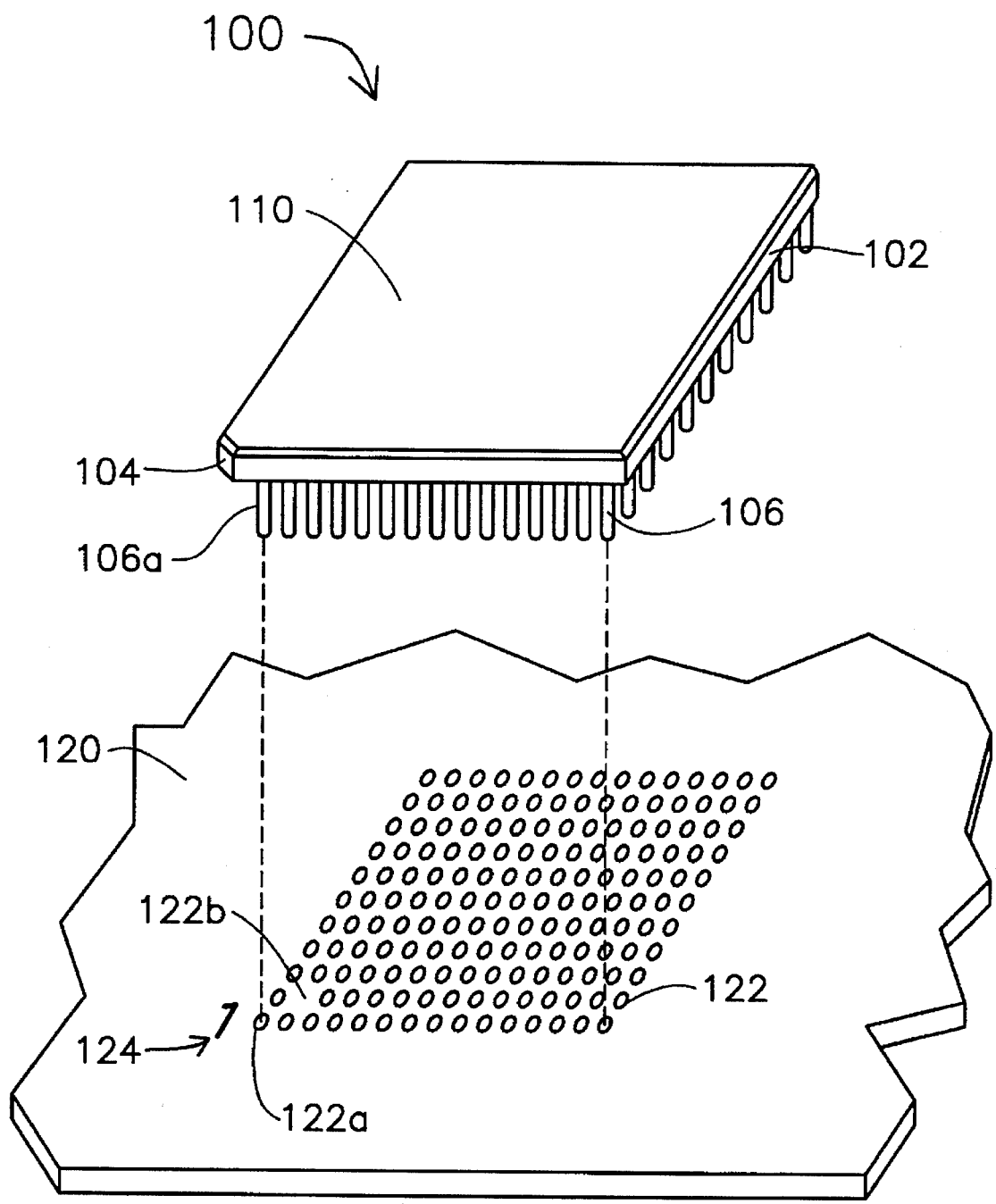
FIG. 1 is an exploded view of a prior-art assembly of a packaged integrated circuit device and a printed circuit board.

FIG. 1 shows a generic, packaged integrated circuit 100, and is intended to be representative of any conventional package. This Figure is included to show some of numerous ways that others have provided features on integrated circuit packages and printed circuit boards, and is not intended in any way to be a limiting representation of the prior art.

A package body 102 of the integrated circuit 100 has four corners, one of which 104 is chamfered to indicate a particular orientation of the package (e.g., the location of pin number 1). The package body has a top surface 110, and a bottom surface opposite the top surface. A plurality of pins 106 extend from the bottom surface of the package body in a rectangularly shaped array, and are electrically connected to a semiconductor (integrated) circuit die (not shown) contained within the package body 102. The integrated circuit 100 may be mounted to a printed circuit board (PCB) 120 having a plurality of holes 122 for receiving the plurality of pins 106, and the pins and holes may be arranged in symmetrical arrays or about the periphery of the package. Evidently, in such a case, the device 100 could be inserted in any of four orientations into the PCB 120—only one of which orientation is correct. To ensure that the device 100 is inserted into the PCB 120 in the proper orientation, the chamfered corner 104 indicates a particular orientation, and the printed circuit board may be provided with a mark 124 ("1"), or the like, indicating the location of a particular hole 122a corresponding to pin #1 which can be established to be the pin 106a nearest to the chamfered edge 104 of the package 102. In order to ensure correct placement of the integrated circuit 100, one of the pins 106 in the rectangular array may also be omitted (as shown) from the integrated circuit 100 (not shown), in which case the corresponding location (area) 122b of the printed circuit board 120, which otherwise would have a hole, does not have a hole, thereby preventing insertion of the integrated circuit 100 into the printed circuit board 120 in any orientation other than the correct orientation (as depicted). This technique of omitting a pin and a hole is commonly known as "keying".

Although the integrated circuit 100 and the printed circuit board are "keyed", many of the pins 106 will line up with holes 122 even if the integrated circuit 100 is oriented incorrectly (e.g., rotated 90, 180, or 270 degrees from the correct orientation). If an attempt is made to press the integrated circuit 100 down towards the printed circuit board 120 in this incorrect orientation, the pin 106 at the location of the missing "key" hole 122b will be bent or broken, thereby damaging the integrated circuit 100.

The approaches discussed hereinabove, with respect to FIG. 1, illustrate the "mechanical" approach that is typically taken to indicating the correct orientation of a semiconductor device (typically, the location of pin #1). Similar situations result with the use of ball-grid arrays, packages having peripheral pins, of TAB arrays, and the like.

Typically, integrated circuit packages are black in appearance, and have some white lettering applied to an external surface of the package body, indicating the manufacturer and part number of the device, but are also occasionally white ceramic with black lettering.

It will be readily understood by one of ordinary skill in the art that for the purposes of the present invention, a "printed circuit board", as used herein, can be any substrate for receiving integrated circuit devices.

Figure 2:
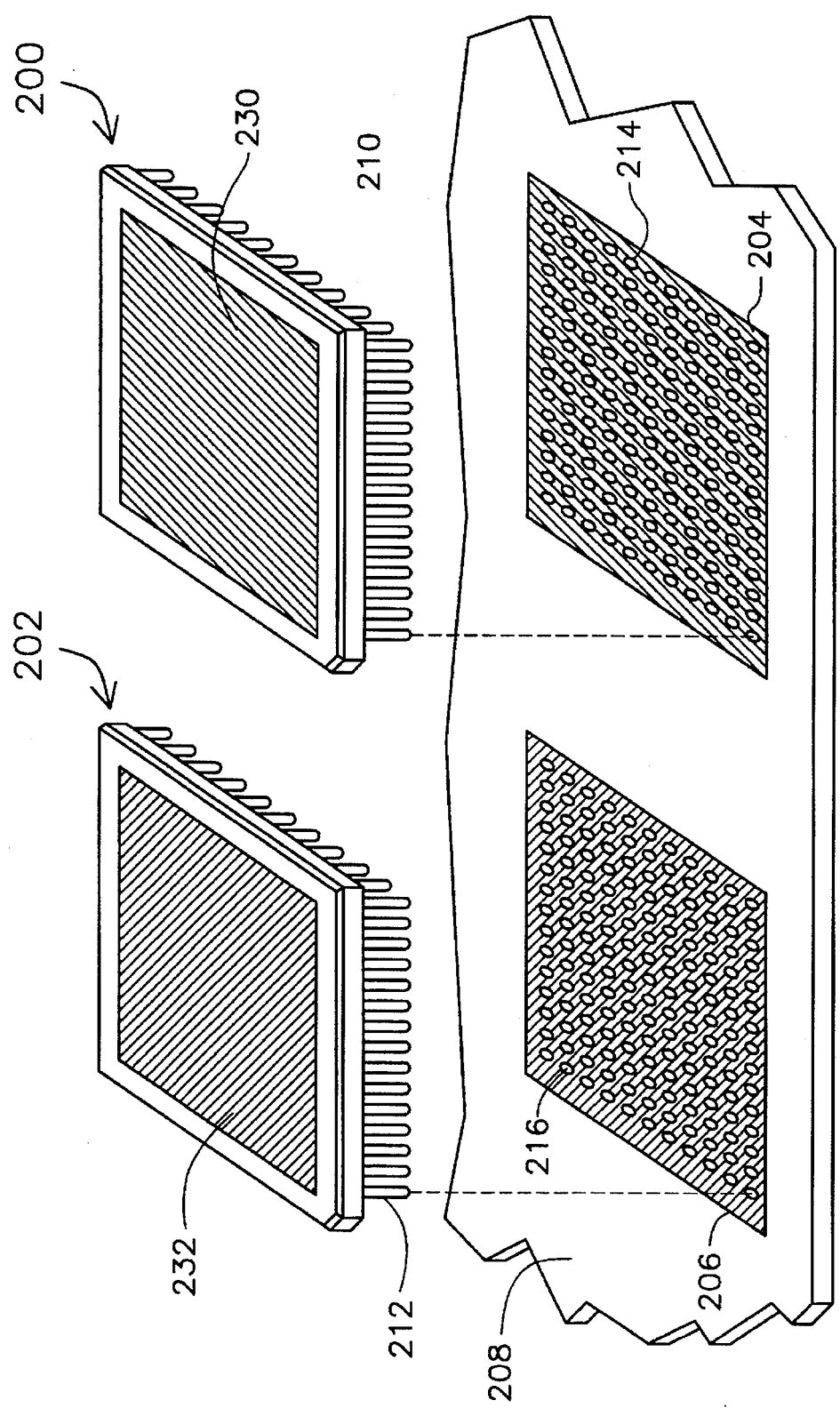
FIG. 2 is an exploded view of an assembly of two packaged integrated circuit devices to a printed circuit board, according to the invention.

FIG. 2 shows two different integrated circuit devices 200 and 202 positioned for insertion into two corresponding locations 204 and 206 on a printed circuit board (PCB) 208. The devices 200 and 202 are the same size as one another, and have the same configuration of pins 210 and 212 as one another. (They are also shown having the same chamfered corner as one another.) However, they are functionally different than one another. The device-receiving areas 204 and 206 on the PCB both (each) have an array of holes 214 and 216, respectively, for receiving the corresponding pins 210 and 212 of a device 200, 202. The areas 204 and 206 are virtually indistinguishable from one another. Evidently, if the device 200 is inserted into the area 206 (likewise, if the device 202 is inserted into the area 204), the board (i.e., system) will not function properly.

According to the present invention, the dissimilar devices 200 and 202 may comprise a "chipset"—in other words, two devices (such as a microprocessor and a peripheral controller) that are intended to work with one another.

In order to ensure that the correct device (200 or 202) is inserted into (mounted at) the correct area of (position on) the PCB 208, the packages of the devices are provided with indicia allowing an observer (e.g., user) to readily, visually discriminate between the two, otherwise identical appearing, devices. In addition to aiding an observer in verifying correct assembly, the indicia permit an observer to quickly identify the components at distances well beyond ordinary reading distance. For the purposes of this specification, "reading distance" is a distance of an observer to an object (e.g., integrated circuit package) beyond which printed text markings on the object cannot readily be discerned. For example, text markings on a typical integrated circuit package cannot be comfortably discerned beyond a distance of about two or three feet.

In the embodiment of FIG. 2, the indicia are labels 230 and 232 applied to the top surfaces of the devices 200 and 202, respectively, each label covering substantially the entire exposed (e.g., after mounting to the PCB) surface of the respective device package body.

Alternatively, the indicia can be "painted" (e.g., sprayed or silk-screened) onto the surface, or embedded into the package material, of the device to achieve substantially the same visual result.

Figure 2A:
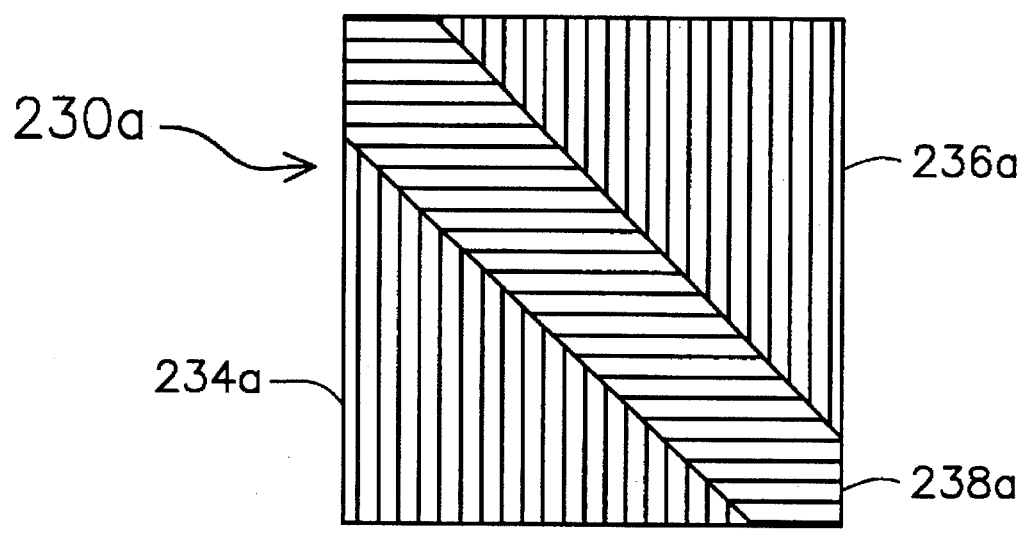
FIGS. 2a and 2b are top views of multi-colored indicia, according to the invention.
Figure 2B:
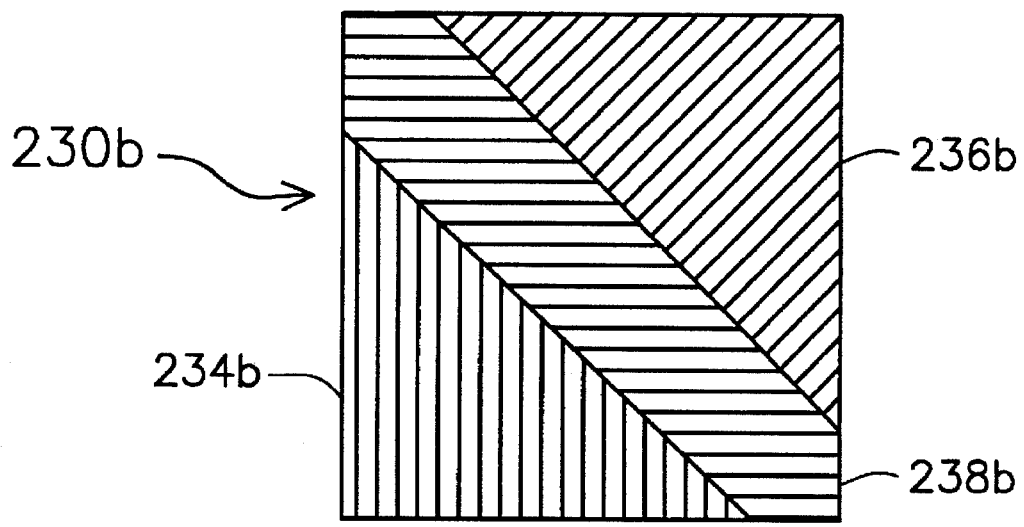

One of ordinary skill in the art will readily appreciate that it is possible, in order to increase the number of different indicia (beyond the limited number of distinct single colors), to provide indicia having two or more colors. Each of the two or more colors is not black or white (being shade, and not colors)—each of the two or more colors is, for example, blue, green, yellow, orange, red, purple, or the like. FIGS. 2a and 2b are examples of such multi-colored indicia.

The integrated circuit receiving areas of the printed circuit board can readily be colored to match (correspond with) the indicia of the integrated circuit devices intended to be mounted in those areas. For example, a green colored device will be mounted in a green colored area on the board, and a red colored device will be mounted in a red colored area on the board. As will be evident from FIGS. 2a and 2b, inter alia, information regarding the correct orientations of a device on a board may also be indicated by single or multi-colored indicias on a surface of the integrated circuit device package.

FIG. 2a is a view of a two-color indicia 230a which, for example, could be applied as a label, coating or embedded into the package material of a surface (all such means and equivalents are referred to hereinafter as a "label") of a packaged semiconductor device in the manner indicated in FIG. 2. The multi-colored indicia 230a is substantially square (although, it need not be this shape), and has a diagonal portion 238a dividing the square shape of the indicia 230a into two triangular-shaped portions 234a and 236a on opposite sides of the diagonal color band 238a. The two triangular-shaped portions 234a and 236a are of a first color (e.g., red), while the diagonal portion 238a is of another, contrasting color (e.g., green). Different color schemes of multi-colored indicia can be used to convey a wide range of information about the packaged device, according to the invention.

Alternatively, FIG. 2a may show a single color indicia as by the section 238a being of a shade (either black or white), while sections 234a and 236a are colored (e.g., green, or blue, or red, etc.). Also, a single color indicia would result if sections 236a and 234a were of a shade (black or white) and section 238a were colored (e.g., blue), or all sections 234a, 236a and 238a were colored (e.g., orange). Thus, black and white may form surroundings, peripheries, internal shapes (simple and complex) such as writings or logos on or in the single or multi-colored indicia of the present invention.

FIG. 2b shows an example of a multi-colored indicia 230b composed of three distinguishable colors. The shape of the indicia 230b is identical to the indicia 230a of FIG. 2a, having two triangular shaped portions 234b and 236b on opposite sides of a diagonal portion 238b. In this case, however, each of the three portions (234b, 236b, 238b) is of a different color, for example red, green and yellow. Alternatively, two portions (i.e., 234b and 236b, or 236b and 238b, may be colored, while the remaining portion (238b or 234b, respectively) is black or white. Evidently, by using more distinguishable colors in an indicia, a greater range of information about a packaged device can be conveyed, according to the present invention. Further, with two or more colors used in the indicia, there are many possibilities for the pattern of the colors, in which case different patterns will convey information about the packaged device, according to the invention.

It will readily be appreciated by one of ordinary skill in the art that there are many possible different multi-color configurations. Some examples are: checkerboard patterns, "plaid" colored patterns, "semaphore flag" patterns (i.e., shaped and colored like semaphore flags or naval flags), striped patterns, and logos. Any such indicia can be formed in one or more colors to provide a visual indication of some characteristic of the integrated circuits upon which they appear. Generally, two-color and multi-color indicia are formed with dissimilar coloration within a defined area (or areas) of the surface of the integrated circuit on which they appear, and all such color markings are according to the present invention.

One of ordinary skill in the art will also appreciate that the body of the integrated circuit package (e.g., 200, 202) can be formed of a (non-black, non-white) colored material (especially well suited to plastic packages) to provide an overall coloration of the integrated circuit package. This body coloration can provide an indication in and of itself, or it can be used as a "base" color upon which one or more additional colors are applied to form a two-color or multi-color indicia, with the body color providing one of the colors. In other words, the visual appearance of at least an exposed surface of the semiconductor device can be employed, according to the present invention, to convey useful information about the device, irrespective of whether the visual appearance is altered by a label applied to the surface or the inherent coloration of the surface (or even of the entire package body).

According to an aspect of the invention, the indicia (e.g., 230, 232) is applied to (or incorporated into) a substantial portion at least one surface of the device. For example, the indicia covers up to 100% of a visible surface of the device, including at least 95%, at least 90%, at least 85%, at least 80%, and at least 75%.

According to another aspect of the invention, the indicia is applied to (or incorporated into) at least one selected area of at least one surface of the device. For example, the at least one selected area encompasses less than 75% of a visible surface of the device, including less than 70%, less than 65%, less than 60%, less than 55%, less than 50%, less than 45%, less than 40%, less than 35%, less than 30%, less than 25%, less than 20%, less than 15%, less than 10%, and less than 5%.

When the indicia covers an area which is visibly less than the entire area of a surface of the integrated circuit, the position of the indicia on that surface can also be used to convey information about the integrated circuit, such as the location of a reference package side, package corner, or pin, thereby giving a visual indication of the correct orientation of the package in a printed circuit assembly. These aspects of the invention are described more fully with respect to FIGS. 3a and 3b.

Figure 3A:
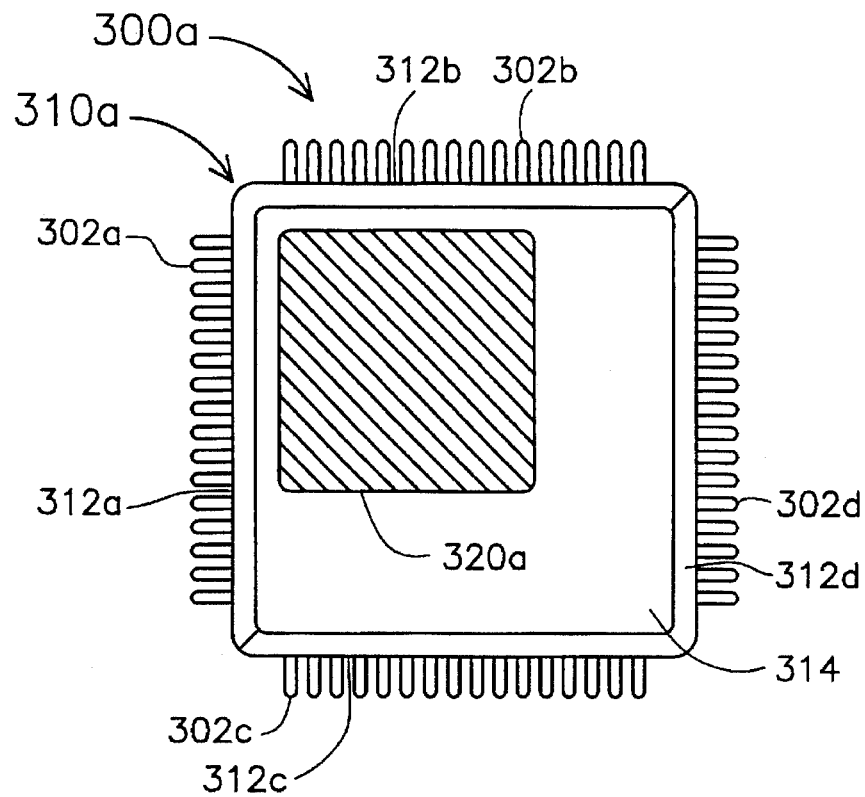
FIGS. 3a and 3b are top views of integrated circuit packages with colored indicia, according to the invention.

FIG. 3a is a top view of an integrated circuit package 300a having leads (electrical connections) shown as peripheral leads (such as gull wing or J-type leads) 302a, 302b, 302c, and 302d disposed along respective sides 312a, 312b, 312c, and 312d of the integrated circuit package 300a. A colored indicia 320a appears on a surface 314 of the integrated circuit package 300a. The indicia 320a occupies an area substantially less than the total area of the surface 314 (e.g., less than 75% of the area of the surface 314), and is positioned towards a reference corner 310a (between sides 312a and 312b) of the integrated circuit package 300a. To an observer, this positioning of the indicia 320a can be used to visually indicate that the corner 310a is a reference corner. In the case of a pin grid array (or ball grid array) type package, pin (ball) #1 could be the pin at the corner of the pin (ball) array under the corner 310a.

Figure 3B:
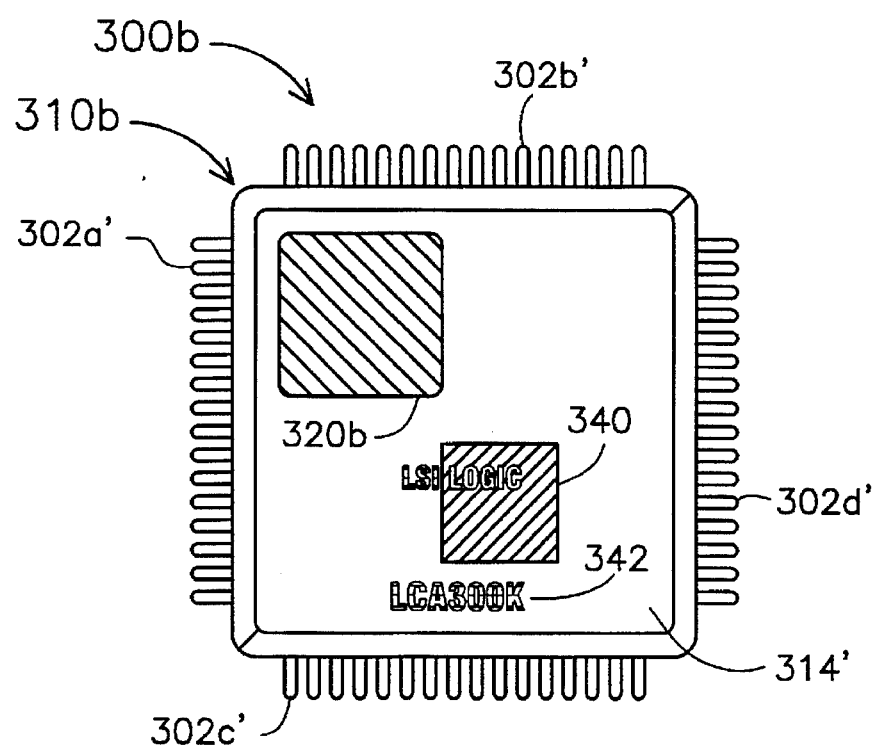

FIG. 3b is a top view of an integrated circuit package 300b, similar to 300a (FIG. 3a), but with different markings. Like the integrated circuit package 300a, the integrated circuit package 300b has leads 302a', 302b', 302c', and 302d' disposed along respective sides of the package 300b. A colored indicia 320b appears on a surface 314' of the package 300b. The indicia 320b has an area less than 25% of the total area of the surface 314', but is significantly larger than characters in a printed text marking 342 on the surface 314', and such colored indicia 320b is readily discerned from distances well beyond reading distance. The indicia 320b is preferably positioned on the surface 314' towards a reference corner 310b of the package (in a manner similar to the offset orientation of the indicia in FIG. 3a). In addition to the colored indicia 320b and printed text markings 342, a colored logo 340 appears on the surface 314'. The logo 340 includes the characters "LOGIC" which are not the color of the square area or necessarily the color(s) of the "LSI" characters. Thus, the "LOGIC" characters could be black or white shades surrounded by the colored square portion—providing a complex internal shaded region to the colored indicia. It will be readily appreciated by one of ordinary skill in the art that the colors of the logo 340 and/or text markings 342 can be used to convey additional visual indications about one or more characteristics of the integrated circuit. In this regard, the logo 340 functions as an indicia, according to the present invention. Alternatively, a majority (e.g., over 75%) of the top surface 314' of the package 300b may be of a color (e.g., blue) with one or more or the areas 320b, logo 340 and/or text markings 342 being colored (e.g., orange) or a shade (i.e., black or white).

As integrated circuit technology has developed, particularly with respect to multi-level metal wiring layers on integrated circuit dies, it has become increasingly feasible to organize the pin positions on an integrated circuit package to which logic signals are assigned according to functional groupings. For example, all control signals can be grouped together in one pin group, all data bus signals can be grouped together in another pin group, and all address bus signals can be grouped together in yet another pin group. These pin groups can be chosen at specific positions on the package body to facilitate signal routing between (preferably adjacent) interconnected chips.

According to an aspect of the present invention, colored indicia can be used to indicate the location of such pin groups on an integrated circuit package. Examples of indicia used to indicate pin group location are given in FIGS. 4a, 4b, and 5.

Figure 4A:
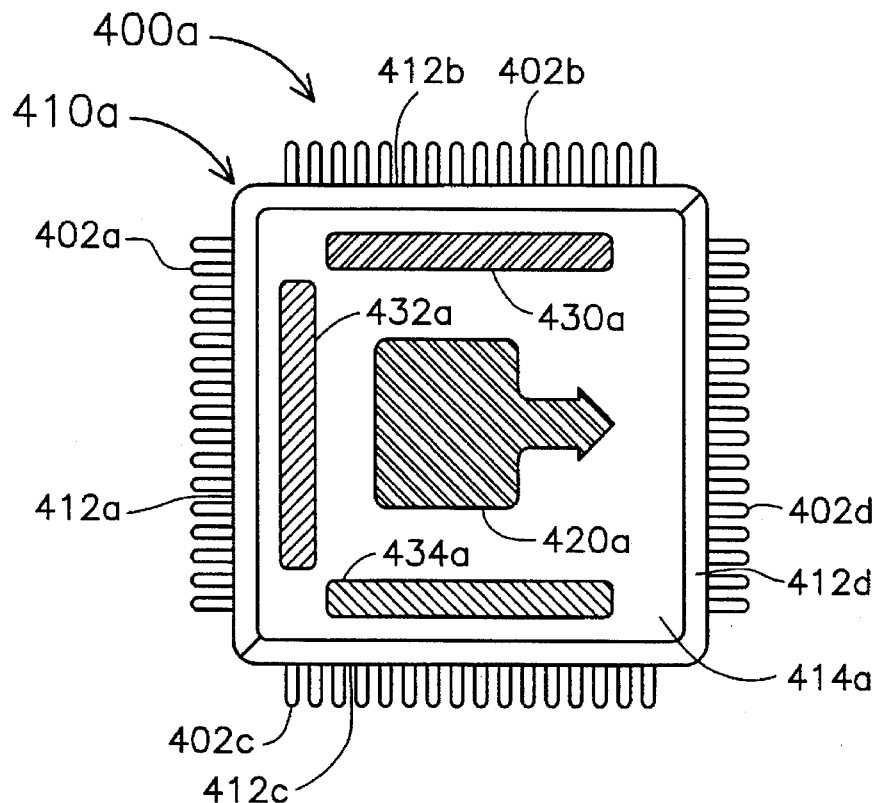
FIGS. 4a and 4b are top views of integrated circuit packages with colored indicia generally indicating functionality of various groups of pins on the packages, according to the invention.

FIG. 4a is a top view of an integrated circuit package 400a having a package body 410a, and contrasting colors of indicia 420a, 430a, 432a, and 434a disposed on a surface 414a of the package 400a. Arrays of leads 402a, 402b, 402c, and 402d are disposed along respective sides 412a, 412b, 412c, and 412d of the integrated circuit package 400a. The indicia 420a is of a first color and is shaped with an arrowhead pointing towards a reference side (412d) of the package 400a. The indicia 432a has an elongated shape, is of a second color, and is positioned along the side 412a of the package to indicate that a first pin group (e.g., carrying a group of control signals) exists within the pins (leads) 402a. The indicia 430a has an elongated shape, is of a third color and is positioned along the side 412b of the package to indicate that a second pin group (e.g., carrying a group of data bus signals) exists with the pins 402b. The indicia 434a also has an elongated shape, is of a fourth color, and is positioned along the side 412c of the package to indicate that a third pin group (e.g., carrying a group of address bus signals) exists within the pins 402c. The second, third and fourth colors should be dissimilar from each other, but any one can be the same as the first color. Preferably, other packages to which the integrated circuit package 400a is to be connected (e.g., via a PCB) will have similarly color-coded pin group indicating indicia, where similar colors indicate similar pin group functions.

Figure 4B:
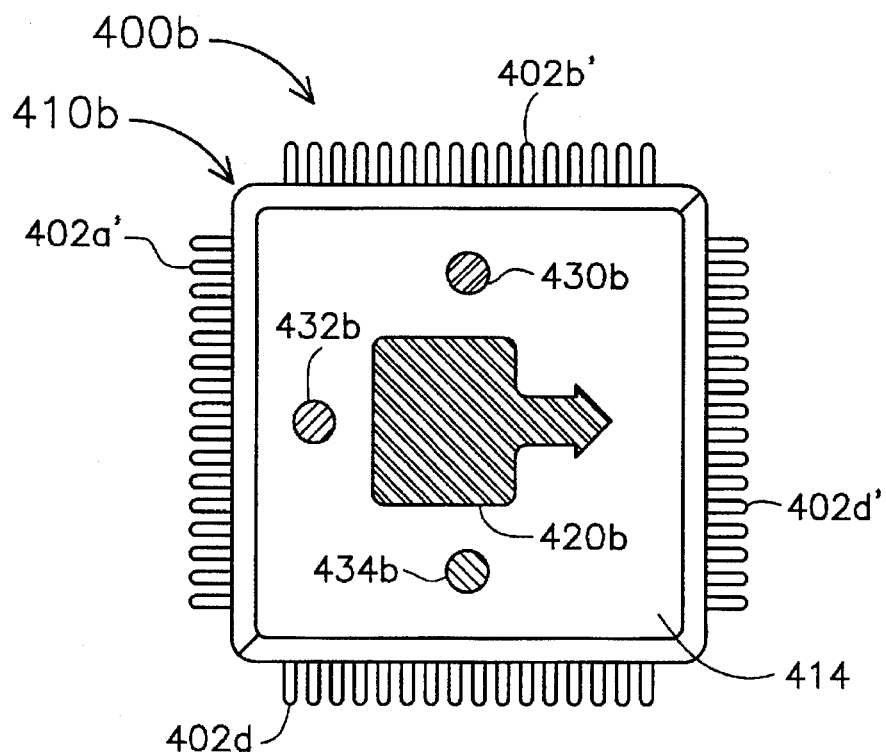

FIG. 4b is a top view of an integrated circuit package 400b (similar to 400a) having a package body 410b, and similar to the package 400a of FIG. 4a. Again, there are a number of indicia 420b, 430b, 432b, and 434b on a surface 414b of the package 400b colored to contrast with the basic color of the package body (e.g., black). Like the package 400a, package 400b has arrays of pins (leads) 402a', 402b', 402c', and 402d' disposed along respective sides thereof. As in FIG. 4a, a central indicia 420b is of a first color and is shaped with an arrowhead pointing towards a reference side of the package 400b. The indicia 432b has a circular shape (e.g., it is a dot), is of a second color, and is positioned along a first side (edge) of the package to indicate that a first pin group (e.g., carrying a group of control signals) exists within the pins 402a'. The indicia 430b has a similar circular shape, is of a third color and is positioned along another side of the package to indicate that a second pin group (e.g., carrying a group of data bus signals) exists with the pins 402b'. The indicia 434b also has a circular shape, is of a fourth color, and is positioned along the side of the package to indicate that a third pin group (e.g., carrying a group of address bus signals) exists within the pins 402c'. Preferably, other packages to which the integrated circuit package 400b is to be connected would have similarly color-coded pin group indicating indicia, where similar colors indicate similar pin group functions.

By way of analogy, it will be readily appreciated by one of ordinary skill in the art that the colored pin group indicating indicia (e.g., of FIGS. 4a and 4b) can be matched up by function on adjacent and interconnected integrated circuit packages in a manner similar to the way dots are used to indicate the end-to-end match-up of dominoes. In a system having a plurality of integrated circuits laid out on a PCB, the proper relative position and orientation of a given integrated circuit with respect to the remaining integrated circuits can be visually, ergonomically, and inherently indicated by coloring schemes such as those discussed herein. For example, a good visual indication can be provided of common pin functionality and of the path of signal routing on printed circuit boards.

It will also be readily appreciated by one of ordinary skill in the art that a single unique color can be used to indicate that an indicia is a pin group indicator. "Dot" indicia (similar to those shown in FIG. 4b) can then be provided in closely-spaced groups along a package side to indicate the location of pin groups. For example, a single dot indicia can be used to indicate a first pin group, two closely spaced dot indicia can be used to indicate a second pin group, three closely spaced dot indicia can be used to indicate a third pin group, etc.

The examples given herein of providing indicia on integrated circuit packages are not limited to any particular packaging technique, and are applicable to virtually any packaging technique.

Figure 5:
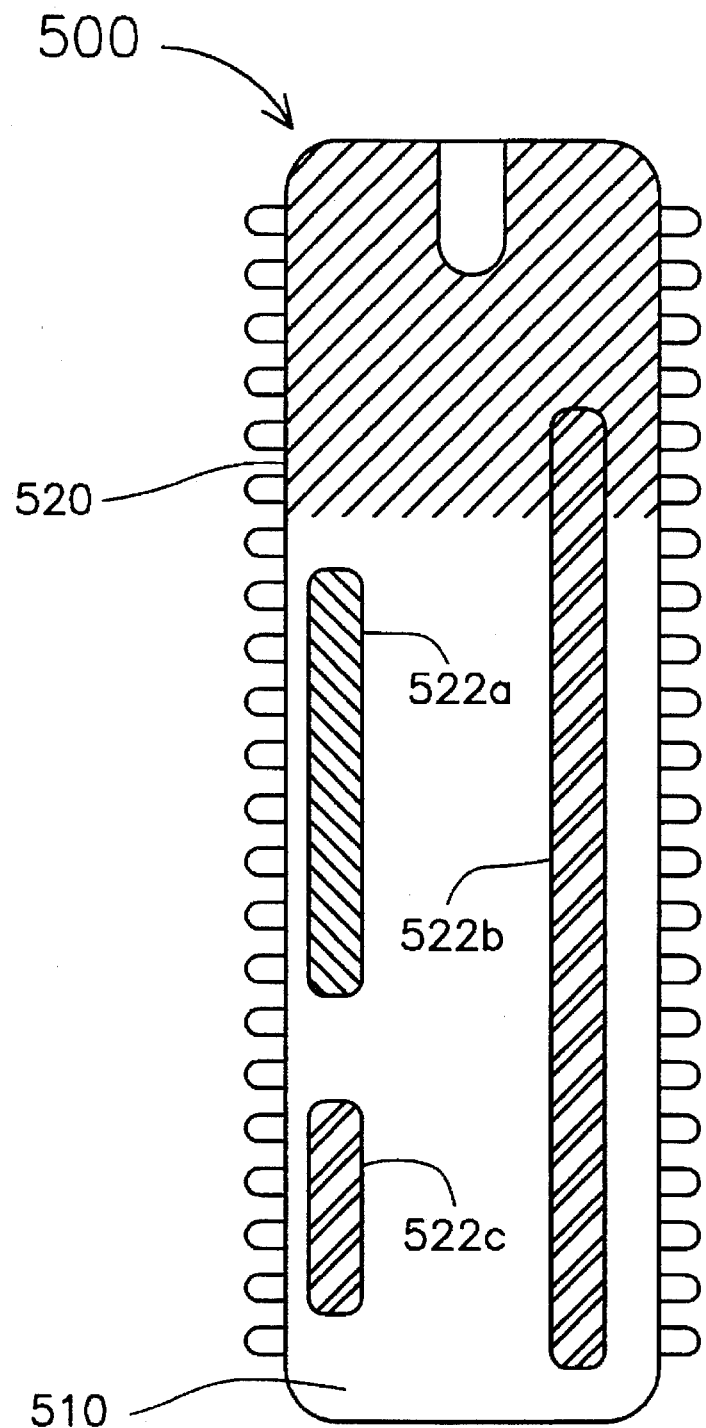
FIG. 5 is a top view of a DIP package with various types of colored indicia, according to the invention.

FIG. 5 is a top view of a DIP (Dual Inline Package) integrated circuit package having four colored indicia 520, 522a, 522b, and 522c on a surface 510 thereof. One of the four indicia, indicia 520, is of a first color and covers an area substantially less than the area of the surface 510 and is positioned to indicate a reference end of the package 500. The color of indicia 520 (colors, if a multi-colored indicia is used) can be selected to indicate one or more characteristics of the integrated circuit contained within the package 500 or of the package 500 itself. The remaining three indicia, 522a, 522b, and 522c, are all colored differently, have elongated shapes, and are used to indicate the location of pin groups on the package 500. Each pin group indicia (522a, 522b, 522c) is positioned along an edge of the package 500 and is positioned to correspond to the location of pins within its respective pin group. If, for example, the integrated circuit is an 8-bit microprocessor, the pin group represented by indicia 522a can be a data signal pin group, the pin group represented by indicia 522b can be an address signal pin group, and the pin group represented by indicia 522c can be a control signal pin group. As with other pin group indicating indicia discussed hereinabove, the colors of the indicia correspond to those of pin group indicia representing corresponding pin group functions on other integrated circuit devices to which the package 500 is to be connected.

Figure 6:
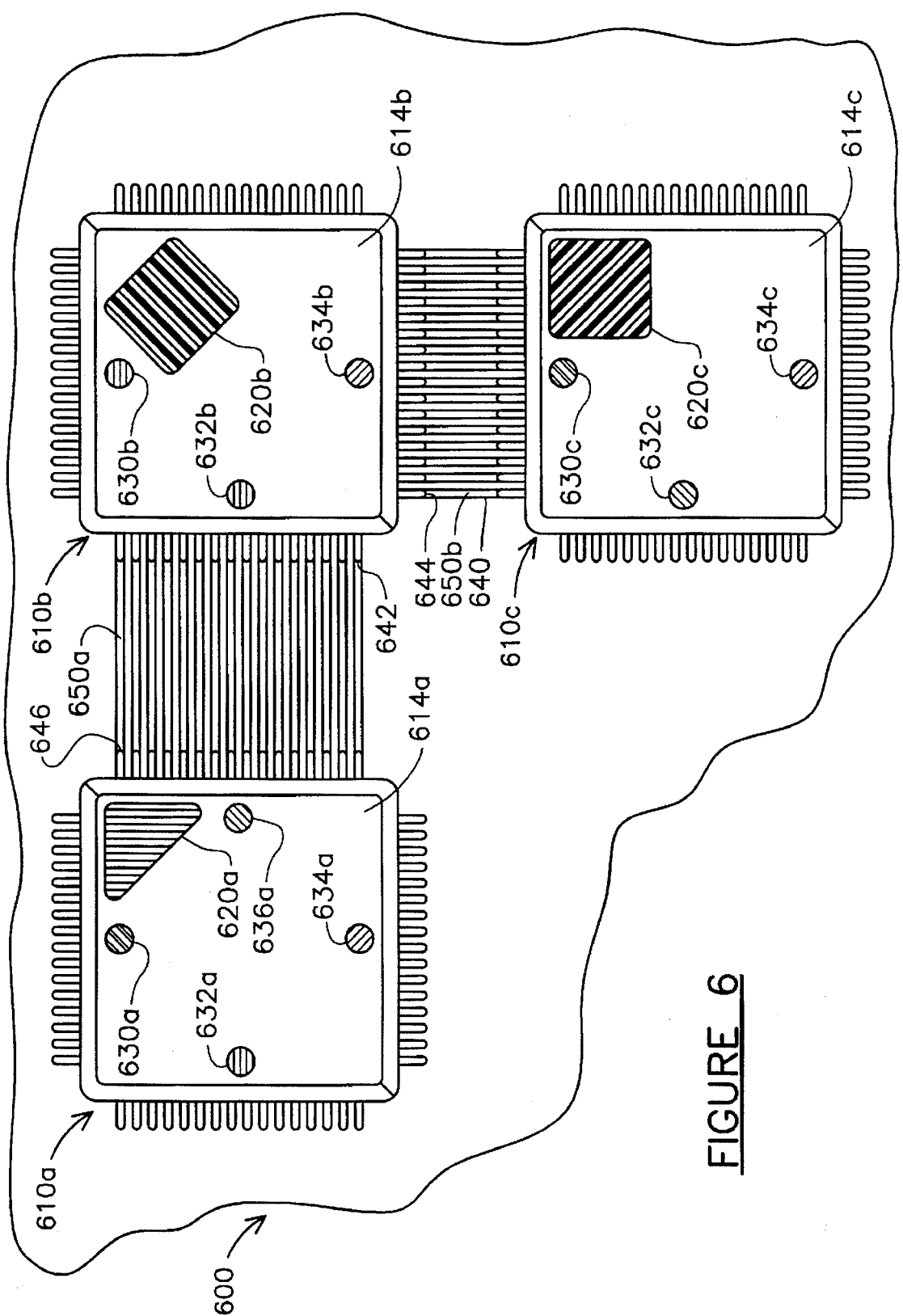
FIG. 6 is a top view of a portion of a printed circuit assembly, according to the invention.

FIG. 6 is a top view of a portion of a printed circuit board assembly 600 incorporating three integrated circuits 610a, 610b, and 610c, each having colored indicia on their respective top surfaces, 614a, 614b, and 614c. Each integrated circuit 610a, 610b, and 610c has a respective indicia 620a, 620b, and 620c, smaller than 25% of the total area of the surface (614a, 614b, or 614c) upon which it appears. Each indicia 620a, 620b, and 620c is shaped and colored to indicate one or more characteristics of the integrated circuit upon which it appears, is positioned adjacent a reference corner of its respective integrated circuit (610a, 610b, 610c), and is readily discernable to the naked eye at distances well beyond reading distance. The integrated circuit 610a has four pin-group indicias 630a, 632a, 634a, and 636a, each colored to represent a particular pin group function and positioned adjacent a side of the integrated circuit 610a along which the pin group represented by the pin group indicia is disposed. (Evidently, in the example of FIG. 6, each pin groups represented by the pin group indicia on all of the integrated circuits include all of the pins along the corresponding side of the integrated circuit. One of ordinary skill in the art will appreciate that it is also possible to indicate pin groups which represent smaller groups of pins.) Similarly, integrated circuit 610b has three pin group indicias 630b, 632b, and 634b, each colored to represent a particular pin group function and positioned adjacent a side of the integrated circuit 610b along which its corresponding pin group is disposed. Integrated circuit 610c also has three pin group indicia 630c, 632c, and 634c, each colored and positioned similar to those on the other two integrated circuits 610a and 610b.

Each of the integrated circuits 610a, 610b, and 610c performs a different function, as indicated by its respective indicia 620a, 620b, and 620c (each of which may be a different color, as indicated by the different stripe patterns), and has a pin group connected to a corresponding pin group on one of the other integrated circuits. Integrated circuit 610a has a pin group 646 represented by pin group indicia 636a which is connected by a set of interconnecting conductors 650a to a corresponding pin group 642 represented by pin group indicia 632b on integrated circuit 610b. Because of the common function of the pin groups 646 and 642, their respective indicia 636a and 632b have the same color. Integrated circuit 610b has another pin group 644 represented by pin group indicia 634b which is connected by another set of interconnecting conductors 650b to a corresponding pin group 640 represented by pin group indicia 630c on integrated circuit 610c. Again, because of the common function of the pin groups 644 and 640, their respective indicia 634b and 630c have the same color.

All of the integrated circuits (610a, 610b, 610c) are oriented such that their reference corners (as indicated by indicia 620a, 620b, and 620c) all point in the same general direction (i.e., to the top right, as viewed in the Figure). Since the adjacent, connected pairs of pin groups (i.e., 646, 642 and 644, 640) have same-color corresponding pin group indicia, the facing sides of the connected integrated circuits have same-color pin group indicia facing one another thereby giving the aforementioned matched-dot "domino" appearance of the arrangement of integrated circuits.

Consequently, an observer can readily ascertain, even from a modest distance, that the integrated circuits have all been oriented and assembled correctly.

As discussed hereinabove, integrated circuit body color and/or indicia characteristics can be used to visually indicate one or more characteristics of the integrated circuit upon which they appear. Among the indicia and body characteristics which can be used to convey information are:

indicia shape (e.g., diamond, square, triangle, logo . . . );

indicia color or colors (single or multi-color indicia);

indicia size and/or position;

integrated circuit body color;

number of indicia; and relative positions of indicia.

The number of different colors (and shades) used to convey information is limited only by the ability of the human eye to readily visually differentiate between them. These colors (i.e., the colors contemplated to be used for indicia, according to the present invention) include: red, orange, yellow, green, blue, violet, brown, etc. Dark and light shades of these colors can also be used.

Among the various characteristics of integrated circuit devices which can be indicated by body color and colored indicia are:

testing level (e.g., commercial, industrial, mil-spec);

radiation hardness of the integrated circuit;

functionality (e.g., microprocessor, ALU, peripheral controller, memory device, etc.);

source or origin of the device (e.g., manufacturer, distributor, etc.);

temperature and/or humidity range for operation;

method or process for design or manufacture (e.g., gate array, cell-based, embedded array, or CoreWare (tm) ASIC); of 1.0 micron, 0.8 micron, 0.5 micron, 0.35 micron process for manufacture of the integrated circuit; or 2, 3, 4 or higher layers of interconnect metal on the integrated circuit, etc.);

device speed;

availability of added (optional) functionality;

location and function of groups of functionally related pins of the integrated circuit device; and location of reference pin, side, corner, etc.

testing level (e.g., commercial, industrial, mil-spec);

radiation hardness of the integrated circuit;

functionality (e.g., microprocessor, ALU, peripheral controller, memory device, etc.);

source or origin of the device (e.g., manufacturer, distributor, etc.);

temperature and/or humidity range for operation;

method or process for design or manufacture (e.g., gate array, cell-based, embedded array, or CoreWare (tm) ASIC); of 1.0 micron, 0.8 micron, 0.5 micron, 0.35 micron process for manufacture of the integrated circuit; or 2, 3, 4 or higher layers of interconnect metal on the integrated circuit, etc.);

device speed;

availability of added (optional) functionality;

location and function of groups of functionally related pins of the integrated circuit device; and location of reference pin, side, corner, etc.

Certain of these integrated circuit characteristics are best indicated by specific indicia characteristics. For example, the location of a reference position or pin group on an integrated circuit (e.g., location of pin 1 or the location of a pin group) is best (preferably) indicated by an indicia position or shape. (That is, an indicia positioned adjacent the reference position or a feature of the indicia, such as an arrowhead, pointing to the reference position).

Further according to the invention, the dissipation of heat in a semiconductor package can be controlled and/or modified by the coloring of selected areas of the package. It is generally known that different colors will exhibit rates of heat absorption and radiation differing from black or white, even if the same materials are used.

According to the invention, colored (i.e., non-black, non-white) materials, such as colored plastic, epoxy or resin, are used for semiconductor packages to encapsulate or surround integrated circuit (IC) dies. The invention contemplates the use of materials having colors such as red, orange, yellow, green, blue, indigo and violet, as well as mixtures or shades of these colors.

According to a feature of the invention, the coloration (e.g., use of non-black, non-white coloring) can be provided over selected portions of the surface area of the integrated circuit package, including applied to the surface (such as the indicia discussed hereinabove), incorporated into the material of the package body, or applied to a lid of a lidded package. These selected, colored areas may correspond (i.e., be in close proximity to) to a particularly hot, or particularly cool area of the die. For example, a color which is a good dissipator of heat can be applied to an area of the package in close proximity to a particularly hot area of a die, and a color which is a relatively poor dissipator of heat can be applied to an area of the package in close proximity to a relatively cool area of the die. In this manner, thermal stresses across the entire area of the die can be normalized (equalized) to an extent not otherwise possible with a package that is simply black (e.g.).

It is further contemplated that a package, or a selected portion of a package can have a discrete colored element incorporated therein. Such a colored element may, for example, permit the filtering of light into the package onto a silicon die having photosensitive elements on its surface. The discrete, colored element can be inserted like a "slug" into the package body, or mounted onto the package body like a lens (and shaped like a lens).

According to a feature of the invention, different pigments, made from different materials, exhibit different amounts of reflectivity to non-visible electromagnetic energy. This property can be advantageously employed to control emissions by a semiconductor die within the package, or to control the impact of such energies from the environment onto the packaged die.

For example, selected portions of a package can be colored, in a manner similar to that shown in FIGS. 2, 2A, 2B, 3A and 3B, to control heat (or electromagnetic) dissipation from corresponding selected areas of a die within the package. This functionality would be distinct from, but could be in addition to, providing visual indications of the correct orientation of the package.

It should be recognized that there are numerous possible variations, combinations and permutations of the aforementioned inventive technique, and that it is within the spirit and scope of the present invention to utilize them alone or in combination with one another.

What is claimed is:

1. Integrated circuit package having at least two different colored areas selected to equalize thermal stresses within the package caused by heat generated from an integrated circuit device contained therein, said integrated circuit package comprising:

an integrated circuit device; and a package body having at least two different colored areas selected to equalize the thermal stress within the package caused by heat generated from the integrated circuit device contained therein, wherein the at least two different colored areas have different heat dissipation characteristics than the remaining areas of the package, the at least two different colored areas being located on the package to normalize thermal stresses across the surface area of the integrated circuit device a one of the at least two different colored areas has good thermal dissipation characteristics and is located over a relatively hot spot on the integrated circuit device contained within the package body, and another of the at least two different colored areas has poor thermal dissipation characteristic and is located over a relatively cool spot on the integrated circuit device contained within the package body.

2. Integrated circuit package having a plurality of different colored areas selected to equalize thermal stresses within the package caused by heat generated from an integrated circuit device contained therein, said integrated circuit package comprising:

an integrated circuit device; and a package body having a plurality of different colored areas selected to equalize the thermal stresses within the package caused by heat generated from the integrated circuit device contained therein, wherein each of the plurality of different colored areas have different heat dissipation characteristics and are selected to normalize thermal stresses across the entire surface area of the integrated circuit device.

3. Integrated circuit package, according to claim 2, wherein:

a selected one of the plurality of different colored areas having good thermal dissipation characteristics is located over a hot spot on the integrated circuit device contained within the package body.

4. Integrated circuit package, according to claim 2, wherein:

a selected one of the plurality of different colored areas having poor thermal dissipation characteristics is located over a cool spot on the integrated circuit device contained within the package body.

* * * * *